United States Patent
Suganuma et al.

(10) Patent No.: US 9,484,185 B2
(45) Date of Patent: Nov. 1, 2016

(54) CHARGED PARTICLE BEAM WRITING APPARATUS, AND CHARGED PARTICLE BEAM WRITING METHOD

(71) Applicant: NuFlare Technology, Inc., Yokohama (JP)

(72) Inventors: Mizuna Suganuma, Yokohama (JP); Noriaki Nakayamada, Kamakura (JP); Yasuo Kato, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/942,164

(22) Filed: Nov. 16, 2015

(65) Prior Publication Data

US 2016/0148785 A1 May 26, 2016

(30) Foreign Application Priority Data

Nov. 20, 2014 (JP) .................................. 2014-235901

(51) Int. Cl.
*H01J 37/302* (2006.01)
*H01J 37/317* (2006.01)

(52) U.S. Cl.
CPC ........ *H01J 37/3026* (2013.01); *H01J 37/3174* (2013.01)

(58) Field of Classification Search
USPC ........................ 250/492.22, 492.23
See application file for complete search history.

(56) References Cited

U.S. PATENT DOCUMENTS

2007/0192757 A1* 8/2007 Emi ..................... B82Y 10/00
716/53
2011/0253911 A1* 10/2011 Matsumoto ............ B82Y 10/00
250/492.3

FOREIGN PATENT DOCUMENTS

JP 2012-19066 1/2012

* cited by examiner

*Primary Examiner* — Kiet T Nguyen
(74) *Attorney, Agent, or Firm* — Oblon, McClelland, Maier & Neustadt, L.L.P.

(57) ABSTRACT

A charged particle beam writing apparatus includes a correction term calculation processing circuitry to calculate a correction term which corrects an error of a proximity effect density of a figure pattern to be written, compared against the figure pattern at design stage, a proximity effect correction dose coefficient calculation processing circuitry to calculate a proximity effect correction dose coefficient for correcting a proximity effect, by using the correction term, a dose calculation processing circuitry to calculate a dose of a charged particle beam by using the proximity effect correction dose coefficient, and a writing mechanism to write the figure pattern on a target object by using the charged particle beam whose dose is the dose calculated.

10 Claims, 9 Drawing Sheets

| 1) 0.06 | 4) 0.06 | 7) 0.07 |
|---|---|---|
| 2) 0.06 | 5) 0.08 | 8) 0.1 |
| 3) 0.04 | 6) 0.09 | 9) 0.05 |

| 1) 0.08 | 4) 0.08 | 7) 0.08 |
|---|---|---|
| 2) 0.08 | 5) 0.08 | 8) 0.08 |
| 3) 0.08 | 6) 0.08 | 9) 0.08 |

| 1) | 4) | 7) |
|---|---|---|
| 2) | 5) 0.05 | 8) 0.05 |
| 3) | 6) 0.05 | 9) 0.05 |

CHARGED PARTICLE BEAM WRITING APPARATUS, AND CHARGED PARTICLE BEAM WRITING METHOD

CROSS-REFERENCE TO RELATED APPLICATION

This application is based upon and claims the benefit of priority from the prior Japanese Patent Application No. 2014-235901 filed on Nov. 20, 2014 in Japan, the entire contents of which are incorporated herein by reference.

BACKGROUND OF THE INVENTION

1. Field of the Invention

Embodiments of the present invention relate generally to a multi charged particle beam writing apparatus and a multi charged particle beam writing method, and more specifically, to an apparatus and method that corrects an error (AU error) generated due to being rounded to a minimum unit of the AU (address unit) in execution of data conversion.

2. Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is decreasing year by year. For forming a desired circuit pattern on such semiconductor devices, a master or "original" pattern (also called a mask or a reticle) of high accuracy is needed. Thus, the electron beam (EB) writing technique, which intrinsically has excellent resolution, is used for producing such a high-precision master pattern.

FIG. 9 is a conceptual diagram explaining operations of a variable-shaped electron beam writing or "drawing" apparatus. The variable-shaped electron beam writing apparatus operates as described below. A first aperture plate 410 has a quadrangular aperture 411 for shaping an electron beam 330. A second aperture plate 420 has a variable shape aperture 421 for shaping the electron beam 330 having passed through the aperture 411 of the first aperture plate 410 into a desired quadrangular shape. The electron beam 330 emitted from a charged particle source 430 and having passed through the aperture 411 is deflected by a deflector to pass through a part of the variable shape aperture 421 of the second aperture plate 420, and thereby to irradiate a target object or "sample" 340 placed on a stage which continuously moves in one predetermined direction (e.g., x direction) during writing. In other words, a quadrangular shape that can pass through both the aperture 411 of the first aperture plate 410 and the variable shape aperture 421 of the second aperture plate 420 is used for pattern writing in a writing region of the target object 340 on the stage continuously moving in the x direction. This method of forming a given shape by letting beams pass through both the aperture 411 of the first aperture plate 410 and the variable shape aperture 421 of the second aperture plate 420 is referred to as a variable shaped beam (VSB) system.

First, when layout data (design data) where figure patterns to be written are arranged is generated, the layout data is converted into writing data having a format which can be input to the writing apparatus. Then, when the writing data is input to the writing apparatus, data conversion processing of a plurality of steps is performed for the writing data so that a figure pattern defined in the writing data may be divided into a plurality of shot figures each of which can be irradiated by one beam shot. A design figure pattern defined in the layout data is written on the target object by combining such a plurality of shot figures. In a series of processing described above, since a deviation of an AU (address unit) occurs regarding a figure size in the data when comparing the AU before and after data conversion processing, an error because of an AU error which occurs due to being rounded to a minimum unit being the AU (address unit) occurs regarding the size of each shot figure to be finally written when data conversion is performed. Consequently, against the size of a figure pattern defined in layout data, an error occurs in the size of a figure pattern to be finally written. It is difficult to directly correct AU errors. Conventionally, since the amount of the size of such an error can be relatively ignored compared to the shot size, it has not been taken into account. However, along with recent miniaturization of patterns, the shot size is also becoming miniaturized.

In the electron beam writing, a phenomenon called a "proximity effect" occurs when electron beams irradiate a mask with resist to write or "draw" a circuit pattern thereon. The proximity effect occurs by backscattering of electron beams penetrating the resist film, reaching the layer thereunder to be reflected, and entering the resist film again. As a result, a dimensional variation occurs, that is, a written pattern is deviated from a desired dimension. In order to avoid this phenomenon, a proximity effect correction operation that suppresses such dimensional variation by, for example, modulating a dose is performed in the writing apparatus.

In the conventional proximity effect correction operation, the size of a shot figure to be finally written has not been taken into account. However, with the current tendency of miniaturization of shot sizes, the influence of AU errors on the proximity effect is increasing. Therefore, even if the proximity effect correction operation to modulate the dose is performed by the conventional method, there is a problem that a correction residual error occurs regarding the proximity effect correction.

There is disclosed a technique where resizing is performed for a shot figure by using a resizing value predetermined according to the size, and the amount of proximity effect correction is calculated based on the resized shot figure (e.g., refer to Japanese Patent Application Laid-open (JP-A) No. 2012-019066). However, in the first place, AU errors are difficult to resize, and therefore, it is difficult to solve the problem described above even by using this technique.

BRIEF SUMMARY OF THE INVENTION

According to one aspect of the present invention, a charged particle beam writing apparatus includes a dividing-into-shots processing circuitry configured to divide a figure pattern into a plurality of shot figures each having a size that can be irradiated by one shot of a charged particle beam, a proximity effect density calculation processing circuitry configured to calculate a proximity effect density by using the figure pattern before being divided into the plurality of shot figures, a correction term calculation processing circuitry configured to calculate a correction term which corrects an error of the proximity effect density of the figure pattern to be written, compared against the figure pattern at design stage, a proximity effect correction dose coefficient calculation processing circuitry configured to calculate a proximity effect correction dose coefficient for correcting a proximity effect, by using the correction term, a dose calculation processing circuitry configured to calculate a dose of the charged particle beam by using the proximity effect correction dose coefficient, and a writing mechanism, including a charged particle source, a deflector and a stage on which a target object is placed, configured to write the figure pattern on the target obj ect by using the charged particle beam whose dose is the dose calculated.

According to another aspect of the present invention, a charged particle beam writing apparatus includes a dividing-into-shots processing circuitry configured to divide a figure pattern into a plurality of shot figures each having a size that can be irradiated by one shot of a charged particle beam, a pattern density calculation processing circuitry configured to calculate, by using the plurality of shot figures having been divided, a pattern density in consideration of a dimension error that occurs in a case where the plurality of shot figures is actually written, a proximity effect correction dose coefficient calculation processing circuitry configured to calculate a proximity effect correction dose coefficient for correcting a proximity effect, by using the pattern density, a dose calculation processing circuitry configured to calculate a dose of the charged particle beam by using the proximity effect correction dose coefficient, and a writing mechanism, including a charged particle source, a deflector and a stage on which a target object is placed, configured to write the figure pattern on the target object by using the charged particle beam whose dose is the dose calculated.

According to yet another aspect of the present invention, a charged particle beam writing method includes dividing a figure pattern into a plurality of shot figures each having a size that can be irradiated by one shot of a charged particle beam, calculating a proximity effect density by using the figure pattern before being divided into the plurality of shot figures, calculating a correction term which corrects an error of the proximity effect density of the figure pattern to be written, compared against the figure pattern at design stage, calculating a proximity effect correction dose coefficient for correcting a proximity effect, by using the correction term, calculating a dose of the charged particle beam by using the proximity effect correction dose coefficient, and writing the figure pattern on a target object by using the charged particle beam whose dose is the dose calculated.

According to yet another aspect of the present invention, a charged particle beam writing method includes dividing a figure pattern into a plurality of shot figures each having a size that can be irradiated by one shot of a charged particle beam, calculating, by using the plurality of shot figures having been divided, a pattern density in consideration of a dimension error that occurs when the plurality of shot figures is actually written, calculating a proximity effect correction dose coefficient for correcting a proximity effect, by using the pattern density which has been calculated using the plurality of shot figures, calculating a dose of the charged particle beam by using the proximity effect correction dose coefficient, and writing the figure pattern on a target object by using the charged particle beam whose dose is the dose calculated.

DETAILED DESCRIPTION OF THE INVENTION

In the following embodiments, there will be described a writing apparatus and method that can suppress a correction residual error of the proximity effect resulting from an AU error.

In the following embodiments, there will be described a configuration in which an electron beam is used as an example of a charged particle beam. The charged particle beam is not limited to the electron beam, and other charged particle beam such as an ion beam may also be used. Moreover, a variable shaped electron beam writing apparatus will be described as an example of a charged particle beam apparatus.

First Embodiment

Figure 1:
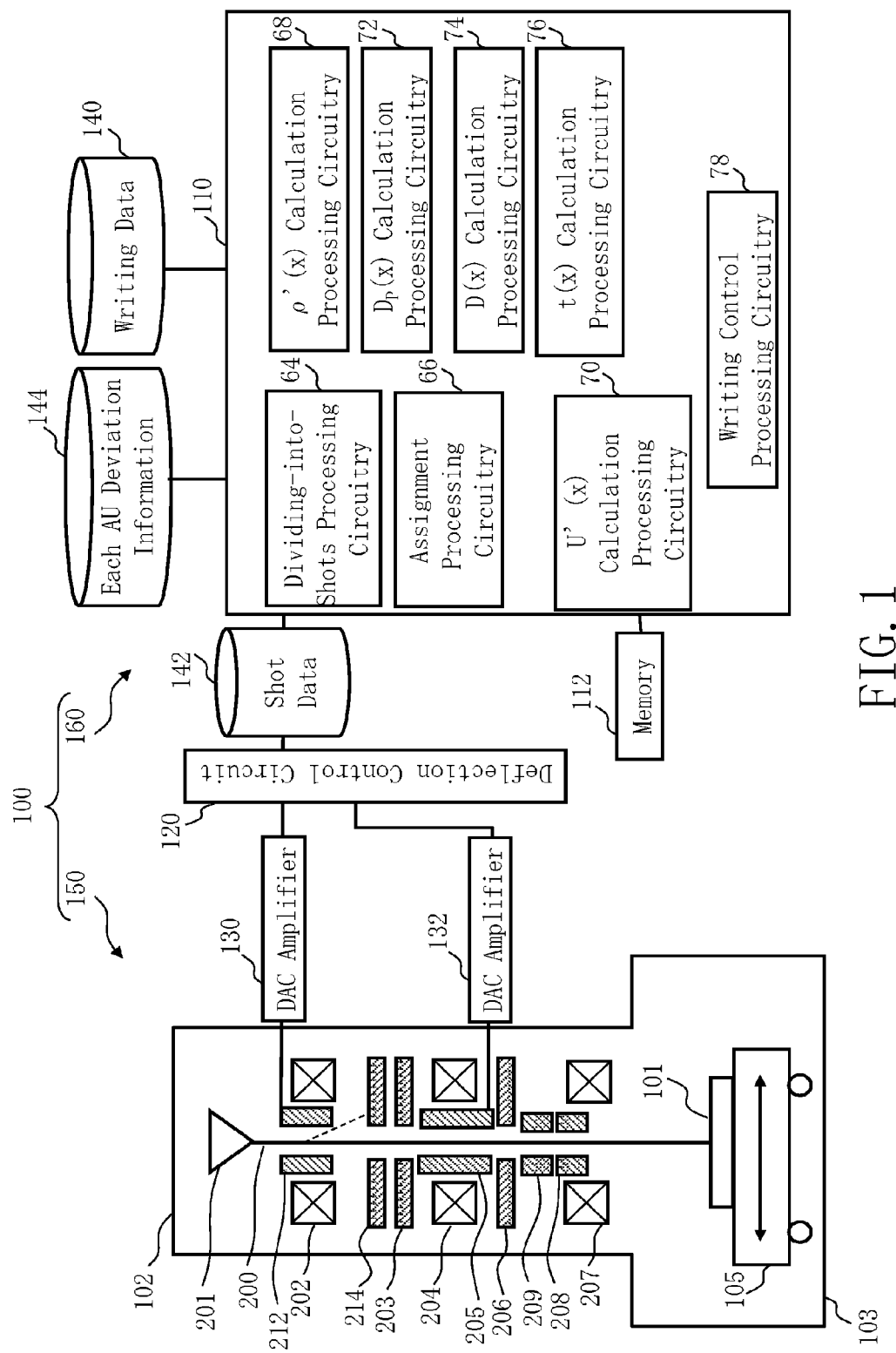
FIG. 1 is a schematic diagram showing a configuration of a writing apparatus according to a first embodiment.

FIG. 1 is a schematic diagram showing a configuration of a writing or "drawing" apparatus according to the first embodiment. In FIG. 1, a writing apparatus 100 includes a writing mechanism 150 and a control unit 160. The writing apparatus 100 is an example of a charged particle beam writing apparatus, and particularly, an example of a variable shaped beam (VSB) writing apparatus. The writing mechanism 150 includes an electron optical column 102 and a writing chamber 103. In the electron optical column 102, there are arranged an electron gun 201 (a charged particle source), an illumination lens 202, a blanking deflector (blanker) 212, a blanking aperture 214, a first shaping aperture plate 203, a projection lens 204, a shaping deflector 205, a second shaping aperture plate 206, an objective lens 207, a main deflector 208 and a sub deflector 209. In the writing chamber 103, there is arranged an XY stage 105 that is movable at least in the x-y direction. On the XY stage 105, there is placed a target object or "sample" 101 (substrate) which serves as a writing target and on which resist has been applied. The target object 101 is an exposure mask, a silicon wafer, and the like used for manufacturing semiconductor devices. The mask may be, for example, a mask blank.

The control unit 160 includes a control computer 110, a memory 112, a deflection control circuit 120, a DAC (digital-analog converter) amplifier units 130 and 132 (deflection amplifiers), and storage devices 140, 142 and 144 such as magnetic disk drives. The control computer 110, memory 112, deflection control circuit 120, and storage devices 140, 142 and 144 are connected with each other through a bus (not shown). The deflection control circuit 120 is connected to the DAC amplifier units 130 and 132. The DAC amplifier 130 is connected to the blanking deflector 212. The DAC amplifier unit 132 is connected to the shaping deflector 205. Description of the DAC amplifier units for the main deflector 208 and sub deflector 209 is omitted.

In the control computer 110, there are arranged a dividing-into-shots processing circuitry 64, assignment processing circuitry 66, ρ'(x) calculation processing circuitry 68, U'(x) calculation processing circuitry 70, $D_p(x)$ calculation processing circuitry 72, D(x) calculation processing circuitry 74, irradiation time t(x) calculation processing circuitry 76, and writing control processing circuitry 78. Each of the processing circuitries includes an electric circuit, a quantum circuit, a computer, a processor, a circuit board, or a semiconductor device, for example. Each of the processing circuitries may use the common processing circuitry (same processing circuitry), or may use different processing circuitries (separated processing circuitries). Input data needed in the control computer 110 or an operation result is stored in the memory 112 each time.

Writing data is input from the outside of the writing apparatus 100, and stored in the storage device 140. Moreover, each AU deviation information to be described later is input from the outside of the writing apparatus 100, and stored in the storage device 144. The AU deviation information includes information of AU unit which is a minimum unit of data format of each data.

FIG. 1 shows a configuration necessary for explaining the first embodiment. Other configuration elements generally necessary for the writing apparatus 100 may also be included.

Figure 2:
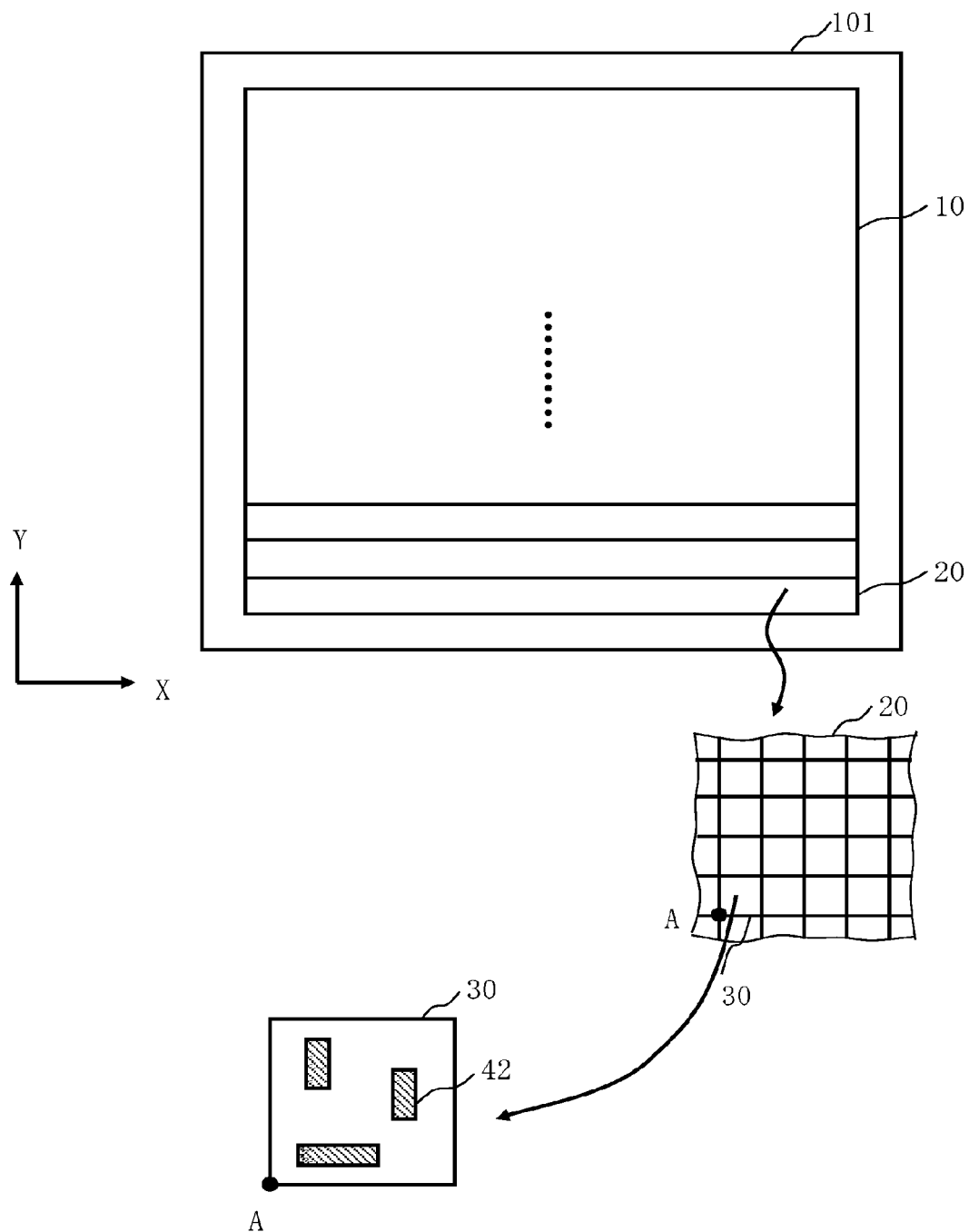
FIG. 2 is a conceptual diagram for explaining each region according to the first Embodiment.

FIG. 2 is a conceptual diagram for explaining each region according to the first Embodiment. As shown in FIG. 2, a writing region 10 of the target object 101 is virtually divided into a plurality of strip-shaped stripe regions aligned along the y direction, for example, by the width deflectable by the main deflector 208. Then, each stripe region 20 is virtually divided into a plurality of mesh-like subfields (SF) 30 (small regions) by the size deflectable by the sub deflector 209. A shot figure is written at each shot position 42 in each SF 30.

A digital signal for blanking control is output from the deflection control circuit 120 to the DAC amplifier unit 130. Then, in the DAC amplifier unit 130, the digital signal is converted to an analog signal and amplified to be applied as a deflection voltage to the blanking deflector 212. The electron beam 200 is deflected by this deflection voltage, and thereby a beam of each shot is formed.

A digital signal for controlling shaping deflection is output from the deflection control circuit 120 to the DAC amplifier unit 132. Then, in the DAC amplifier unit 132, the digital signal is converted to an analog signal and amplified to be applied as a deflection voltage to the shaping deflector 205. The electron beam 200 is deflected by this deflection voltage, and thereby the figure type and the size of a beam of each shot are determined.

The writing apparatus 100 performs writing processing in each stripe region 20 by using a multiple stage deflector. Here, as an example, a two-stage deflector composed of the main deflector 208 and the sub deflector 209 is used. While the XY stage 105 is continuously moving, for example, in the −x direction, a pattern is written in the x direction in the first stripe region 20. After the pattern writing in the first stripe region 20 has been completed, a pattern is written in the same or opposite direction in the second stripe region 20. Then, in the same way, patterns are written in the third and subsequent stripe regions 20. The main deflector 208 deflects the electron beam 200 in sequence to a reference position A of the SF 30 concerned so as to follow the movement of the XY stage 105. The sub deflector 209 (second deflector) deflects the electron beam 200 from the reference position A of each SF 30 to each shot position 42 of an irradiating beam in the SF 30 concerned. Thus, the sizes of the deflection regions of the main deflector 208 and the sub deflector 209 are different from each other.

Figure 3:
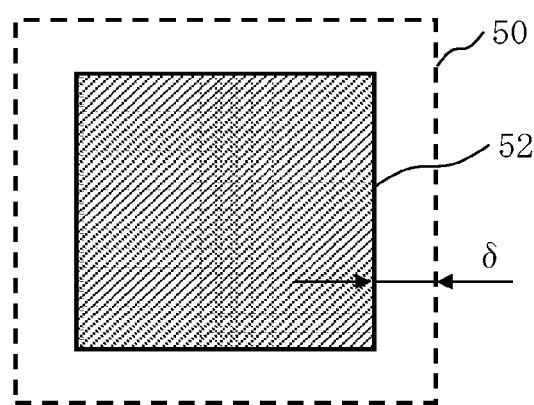
FIG. 3 shows an example of an AU error of a figure pattern according to the first embodiment.

FIG. 3 shows an example of an AU error of a figure pattern according to the first embodiment. As described above, layout data where design figure patterns are arranged is converted into writing data having a format which can be input to the writing apparatus 100, and then, this writing data is input to the writing apparatus. Since the data formats of the layout data and the writing data are different from each other, an AU (address unit) deviation occurs when the conversion is performed. As a result, an AU error (a), which occurs due to being rounded to a minimum unit of the AU (address unit) when the data conversion is performed, occurs in the size of a defined figure pattern. In the writing apparatus 100, data conversion processing of a plurality of steps is performed for the writing data so as to divide a figure pattern defined in the writing data into a plurality of shot figures each of which can be irradiated by one beam shot. Then, by connecting a plurality of shot figures, a design figure pattern is written on the target object. When dividing the writing data into shot figures, since the data format of the shot figure differs from that of the writing data, an AU deviation occurs at the time of conversion. Consequently, an AU error (b) occurs in the size of the divided shot figures. Furthermore, with respect to shot data where the shot figures are defined, when a digital signal is converted into an analog signal by the DAC amplifier 132 which generates a deflection voltage for shaping beams, an Au deviation also occurs because the AU of the digital signal of the DAC amplifier 132 may differ from the AU in the shot data. Consequently, an AU error (c) occurs in the size of the shot figure to be written. Thus, during the period from the stage relating to layout data (design) to the stage relating to an actual writing, a plurality of AU errors (for example, three AU errors), such as the AU error (a), the AU error (b) and the AU error (c), may be accumulated. In the example of FIG. 3, an error occurs regarding the size such that a FIG. 52 to be actually generated is, for example, smaller than a FIG. 50 being an ideal design quadrangle, by the amount of an AU error δ.

Figure 4:
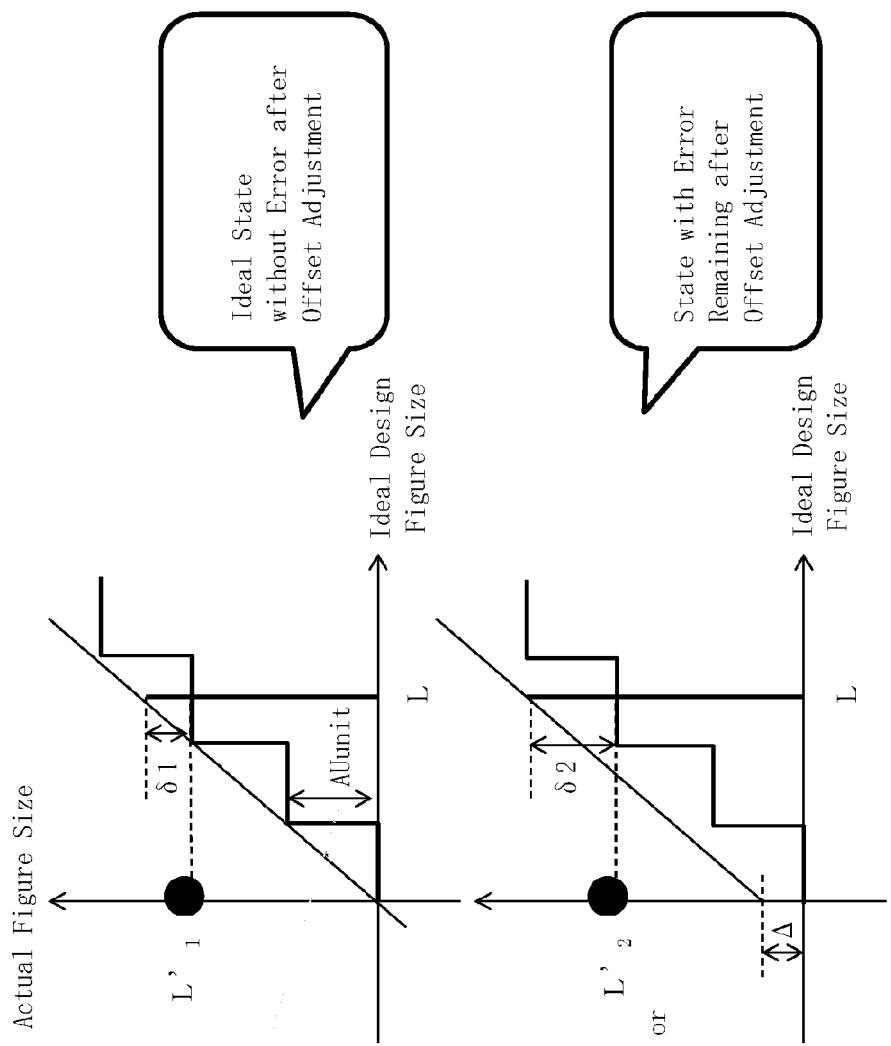
FIGS. 4A and 4B each shows a relation between the size of a design figure pattern and the size actually generated according to the first embodiment.

FIGS. 4A and 4B each shows a relation between the size of a design figure pattern and the size of a figure pattern after conversion according to the first embodiment. As shown in the examples of FIGS. 4A and 4B, in each step being a cause of the three AU errors described above, for example, the size of an ideal design figure is L, whereas the size of a converted figure is $L'_1$ in FIG. 4A or $L'_2$ in FIG. 4B. If there are determined the ideal design figure size L, AU unit, the minimum unit of the AU, and an error Δ which remains after the first offset adjustment performed when starting a writing process (or at every writing a stripe region), the AU error δ1 in FIG. 4A or the AU error δ2 in FIG. 4B can be obtained by performing rounding using the difference of the AU between before and after data conversion. The error Δ can be obtained at the first writing after the offset adjustment or at each time of writing a stripe region. It should be noted that δ1≠δ2 although the size $L'_1=L'_2$. When the figure size L is smaller, the influence of the error on the size of the figure after conversion is large compared with the case of the figure size L being large. It goes without saying that values of the AU errors generated in a plurality of processing steps are different from each other.

With respect to AU errors, for example, if letting the AU error after combining an AU error (b) and an AU error (c) be 0.05 nm, when a dimension error of −0.05 nm at a maximum occurs for the 50% line and space pattern of the shot size 10 nm, the size of the shot figure (line part) actually written is 9.95 nm, and the size of the space part is 10.05 nm.

Therefore, with respect to pattern density 50% in the writing data, the pattern density (rate of area) of a pattern actually written is 49.75%. For example, as to a proximity effect correction coefficient η, when η=0.5, a proximity effect correction dose coefficient $D_p(x)$ at the time of correcting the proximity effect can be defined by the following equation (1) if a simple calculation is performed.

$$D_p(x) = \frac{\frac{1}{2} + \eta}{\frac{1}{2} + \eta U(x)} \quad (1)$$

A proximity effect density U(x) can be defined by the following equation (2) using a pattern density ρ(x) and a distribution function g(x). It is preferable to use a Gaussian function as the distribution function g(x).

$$U(x) = \int \rho(x') g(x-x') dx' \quad (2)$$

Here, since the 50% line and space pattern is used on design, the proximity effect correction coefficient η is set to 0.5, and the proximity effect density U(x) is also set to 0.5. Therefore, Dp=(½+0.5)/(½+0.5×0.5).

Since the pattern density is 49.75% in the shot figure actually written, the proximity effect density U(x) is 0.4975. Therefore, $D_p'$=(½+0.5)/(½+0.5×0.4975). Thus, $D_p'/D_p$=1.0017, and an error occurs 0.17% at the maximum.

In a proximity effect correction operation, if assuming a likelihood DL=0.8 to 1.0 nm/% dose, the CD error in proximity effect correction is 0.14 to 0.17 nm due to the error of 0.17% described above. Therefore, the proximity effect correction error (residual error) resulting from an AU error is about three times the error 0.05 nm of the figure size actually written effected by the AU error. Therefore, according to the first embodiment, the correction residual error of the proximity effect caused by the AU error is suppressed.

If each of specifications of information on AU deviation between layout data and writing data, AU deviation between writing data and shot data, and AU deviation between shot data and DAC amplifier control data is determined, they can be input to the writing apparatus 100 in advance. Therefore, AU unit, the minimum unit of the AU, is known. The error Δ which remains after the first offset adjustment performed when starting a writing process (or at every writing a stripe region) should be input from the writing control processing circuitry 78 after the offset adjustment. Therefore, for each figure pattern defined in writing data, the dimensional deviation resulting from each of a plurality of AU errors such as AU error (a) to AU error (c) of a figure pattern concerned can be calculated. Similarly, the dimensional deviation resulting from each of a plurality of AU errors such as AU error (a) to AU error (c) of each shot figure of after dividing a figure pattern concerned into shot figures can be calculated. Therefore, according to the first embodiment, a proximity effect correction calculation is performed in advance considering AU errors. Moreover, according to the first embodiment, since the correction residual error of a proximity effect based on a figure pattern which is defined in writing data and in which an AU error (a) has already occurred is suppressed, it is sufficient if there is information on AU deviation between writing data and shot data, and on AU deviation between shot data and DAC amplifier control data. Accordingly, it is not necessary to store information on AU deviation between layout data and writing data in the storage device 144.

Figure 5:
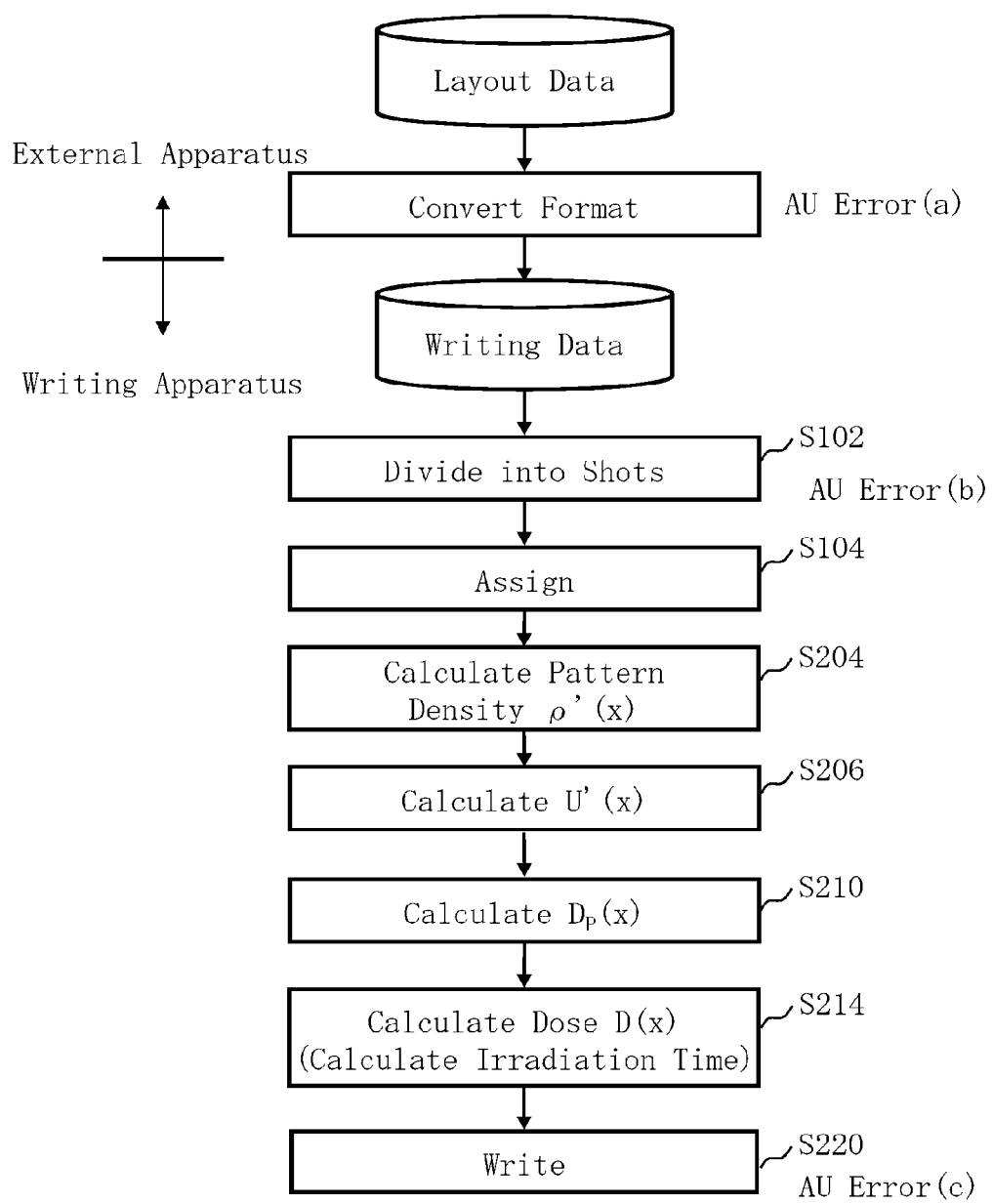
FIG. 5 is a flowchart showing main steps of a writing method according to the first embodiment.

FIG. 5 is a flowchart showing main steps of a writing method according to the first embodiment. As shown in FIG. 5, the writing method of the first embodiment executes a series of steps: dividing-into-shots step (S102), assignment step (S104), pattern density ρ'(x) calculation step (S204), proximity effect density U'(x) calculation step (S206), proximity effect correction dose coefficient $D_p(x)$ calculation step (S210), dose D(x) calculation step (S214), and writing step (S220). Each of these steps is carried out for each stripe region. That is, real-time processing is executed so that each step from the dividing-into-shots step (S102) to the dose D(x) calculation step (S214) of a next stripe region may be finished before the writing step (S220) of the current stripe region may be finished. In that case, the writing control processing circuitry 78 should complete the offset adjustment of the stripe region concerned by the time of starting the pattern density ρ'(x) calculation step (S204) for the stripe region concerned. Thereby, the error Δ after offset adjustment can be acquired.

In the dividing-into-shots step (S102), the dividing-into-shots processing circuitry 64 reads writing data from the storage device 140, and divides a figure pattern defined in the writing data into a plurality of shot figures each having a size that can be irradiated by one shot of the electron beam 200. The file structure of the writing data is formed, for example, for each frame region obtained by virtually dividing the chip region of a writing target chip into strip-like regions. Although a plurality of figure patterns are arranged in a chip, the size which can be formed by one beam shot is limited, in the writing apparatus 100. Therefore, each figure pattern is divided into shot figures each having a size that can be irradiated by one beam shot. In the dividing into shot figures, the size of each shot figure includes an AU error δ that occurs due to being rounded to a minimum unit of the AU when data conversion is performed.

In the assignment step (S104), the assignment processing circuitry 66 assigns each shot figure to a corresponding one of a plurality of mesh regions of a predetermined size obtained by virtually dividing the writing region of the target object 101 into mesh regions. Thereby, the figure type, size, position, etc. of each shot figure are generated as shot data. The shot data is stored in the storage device 142 one by one. The size of a mesh region is smaller than that of a mesh (proximity effect mesh) for proximity effect correction. The size of a proximity effect mesh is set to, for example, about ⅟10 of the influence radius of the proximity effect. For example, it is set to about 1 μm. On the other hand, the size of a mesh region to which a divided shot figure is assigned is set to be smaller than 1 μm.

In the pattern density ρ'(x) calculation step (S204), the ρ'(x) calculation processing circuitry 68 calculates a pattern density ρ'(x) by using a plurality of divided shot figures. Specifically, a pattern density ρ'(x) for each mesh region is calculated. The size of a divided shot figure includes an AU error (a) that occurs when layout data is converted into writing data, and an AU error (b) that occurs when a figure pattern defined in the writing data is divided into a plurality of shot figures. However, an AU error (c) that occurs when converted into a deflection voltage by the DAC amplifier 132 is not included. Then, the ρ'(x) calculation processing circuitry 68 calculates a pattern density ρ'(x) in consideration of an AU error (c) that occurs when each of a plurality of divided shot figures is actually written. In other words, as a dimension error which is taken into consideration, the error that occurs when a deflection voltage is generated by the DAC amplifier 132 is used. The AU error (c) can be calculated by reading information on an AU deviation between shot data and DAC amplifier control data from the storage device 144, and performing calculation using the information on the AU deviation, an error Δ after offset adjustment of a stripe region concerned, and the size and position of a shot figure. Thereby, it is possible to calculate a pattern density ρ'(x) which includes accumulated AU errors and is based on a shot figure to be finally written.

Next, a proximity effect correction dose coefficient $D_p(x)$ for correcting a proximity effect is calculated using the calculated pattern density ρ'(x). Therefore, a proximity effect density U(x) is calculated first.

In the proximity effect density U'(x) calculation step (S206), the U'(x) calculation processing circuitry 70 calculates a proximity effect density U'(x) by using pattern density ρ'(x) which includes accumulated AU errors and is based on a shot figure to be finally written. The proximity effect density U'(x) can be defined by the following equation (3) using the pattern density ρ'(x) based on a shot figure and a distribution function g(x). Preferably, a Gaussian function, for example, is used as the distribution function g(x). Calculation of the proximity effect density U'(x) should be performed per mesh region described above to which a divided shot figure is assigned and whose size is smaller than that of a mesh (proximity effect mesh) for proximity effect correction.

$$U'(x)=\int \rho'(x')g(x-x')dx' \quad (3)$$

The proximity effect density U'(x) is a value which includes accumulated AU errors, for example, and is based on a shot figure to be finally written.

In the proximity effect correction dose coefficient $D_p(x)$ calculation step (S210), the $D_p(x)$ calculation processing circuitry 72 calculates a proximity effect correction dose coefficient $D_p(x)$ for correcting a proximity effect, by using a pattern density ρ'(x) calculated using a plurality of shot figures. The proximity effect correction dose coefficient $D_p(x)$ can be defined by the following equation (4). The proximity effect correction dose coefficient $D_p(x)$ calculated by the equation (4) is a value which includes accumulated AU errors, for example, and is based on a shot figure to be finally written. Therefore, it is possible to suppress a correction residual error of the proximity effect caused by accumulated AU errors, for example.

$$D_p(x) = \frac{\frac{1}{2}+\eta}{\frac{1}{2}+\eta U'(x)} \quad (4)$$

Although, in the example described above, the proximity effect correction dose coefficient $D_p(x)$ is calculated after calculating the proximity effect density U'(x), it is not limited thereto. It is also preferable to simultaneously calculate a proximity effect correction dose coefficient $D_p(x)$ which includes a term of the proximity effect density U'(x).

In the dose D(x) calculation step (S214), the D(x) calculation processing circuitry 74 calculates a dose D(x) of an electron beam by using a proximity effect correction coefficient $D_p(x)$. The dose D(x) can be defined by the following equation (5) using a proximity effect correction dose coefficient $D_p(x)$ and a base dose Db.

$$D(x)=D_b \cdot D_p(x) \quad (5)$$

The irradiation time t(x) calculation processing circuitry 76 calculates an irradiation time by dividing an obtained dose D(x) by a current density J. The calculated irradiation time data (dose data) is stored in the storage device 142.

In the writing step (S220), the writing control processing circuitry 86 starts writing processing by controlling the writing mechanism 150 through the deflection control circuit 120, etc. The writing mechanism 150 writes a figure pattern on the target object 101 with the electron beam 200 of the calculated dose D(x). Specifically, it operates as described below. The deflection control circuit 120 acquires irradiation time data stored in the storage device 142. Then, the deflection control circuit 120 outputs a digital signal which controls the irradiation time of each shot, to the DAC amplifier unit 130. The DAC amplifier unit 130 converts the digital signal to an analog signal and amplifies it to be applied as a deflection voltage to the blanking deflector 212.

With respect to the electron beam 200 emitted from the electron gun 201 (emitter), when passing through the blanking deflector 212, it is controlled to pass through the blanking aperture plate 214 by the blanking deflector 212 when in the beam ON state, and the whole of it is deflected to be blocked by the blanking aperture plate 214 when in the beam OFF state. The electron beam 200 that has passed through the blanking aperture plate 214 during the period from the time of changing from a beam OFF state to a beam ON state to the time of again changing to a beam OFF state serves as one shot of the electron beam. The blanking deflector 212 controls the direction of the passing electron beam 200 to alternately generate a beam ON state and a beam OFF state. For example, when in a beam ON state, no voltage is applied to the blanking deflector 212, and, when in a beam OFF state, a voltage should be applied to it. The dose per shot of the electron beam 200 to irradiate the target object 101 is adjusted depending upon an irradiation time of each shot.

Each shot of the electron beam 200, generated by passing through the blanking deflector 212 and the blanking aperture plate 214, irradiates the whole of the first shaping aperture plate 203 which has a quadrangular opening by the illumination lens 202. At this stage, the electron beam 200 is first shaped to a quadrangle. Then, after passing through the first shaping aperture plate 203, the electron beam 200 of the first aperture image is projected onto the second shaping aperture plate 206 by the projection lens 204. The first aperture image on the second shaping aperture plate 206 is deflection-controlled by the shaping deflector 205 so as to change (variably shape) the shape and size of the beam. Such variable beam shaping is performed for each shot, and, generally, each shot is shaped to have a different shape and size. Then, after passing through the second shaping aperture plate 206, the electron beam 200 of the second aperture image is focused by the objective lens 207, and deflected by the main deflector 208 and the sub deflector 209 to reach a desired position on the target object 101 placed on the XY stage 105 which moves continuously.

That is, according to the first embodiment, even when being difficult to correct the pattern size itself due to a plurality of AU errors (a series of AU errors), it is possible to avoid further increasing a pattern dimension deviation, by performing a proximity effect correction. As described above, the correction residual error of the proximity effect resulting from a plurality of AU errors is larger than the dimension error of a shot figure to be written due to a plurality of AU errors. According to the first embodiment, the correction residual error of the proximity effect resulting from AU errors can be suppressed. Therefore, it is possible to write a pattern with high accuracy in dimensions by performing calculation such that the correction residual error of the proximity effect resulting from a plurality of AU errors is eliminated.

Second Embodiment

In the first embodiment, since calculation concerning the proximity effect is performed per mesh region to which a divided shot figure is assigned and whose size is smaller than that of a mesh (proximity effect mesh) for proximity effect correction, the number of calculation regions is larger than that in the case of performing calculation per proximity effect mesh, and the calculation time period becomes longer. Then, according to the second embodiment, a configuration using a result obtained from calculation per proximity effect mesh will be described below.

Figure 6:
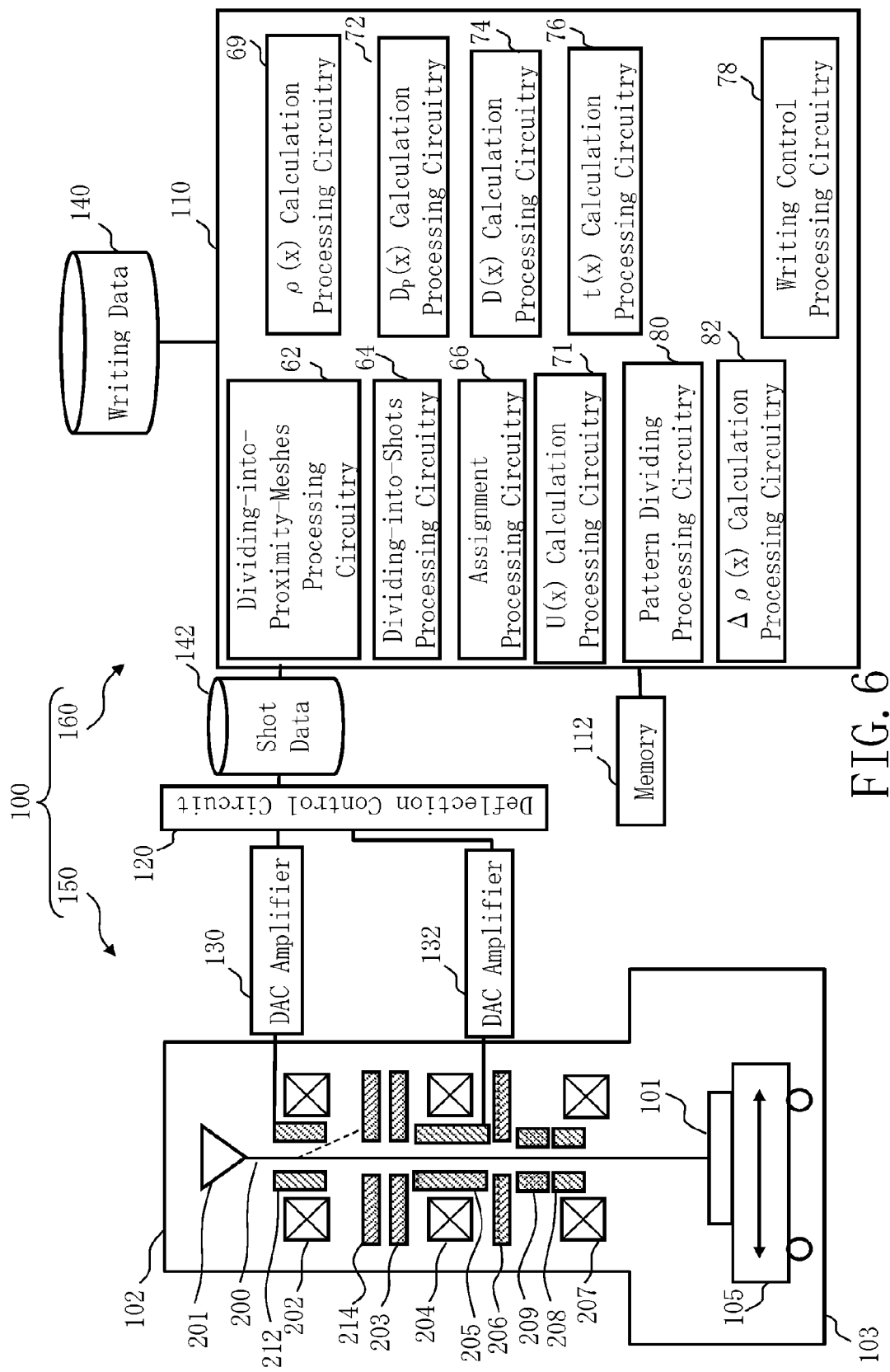
FIG. 6 is a schematic diagram showing a configuration of a writing apparatus according to a second embodiment.

FIG. 6 is a schematic diagram showing a configuration of a writing apparatus according to the second embodiment. FIG. 6 is the same as FIG. 1 except that the configuration of the control computer 110 is different from each other. In the control computer 110, there are arranged a dividing-into-proximity-meshes processing circuitry 62, the dividing-into-shots processing circuitry 64, the assignment processing circuitry 66, a $\rho(x)$ calculation processing circuitry 69, a $U(x)$ calculation processing circuitry 71, the $D_p(x)$ calculation processing circuitry 72, the $D(x)$ calculation processing circuitry 74, the $t(x)$ calculation processing circuitry 76, the writing control processing circuitry 78, a pattern dividing processing circuitry 80, and a $\Delta\rho(x)$ calculation processing circuitry 82. Each of the processing circuitries includes an electric circuit, a quantum circuit, a computer, a processor, a circuit board, or a semiconductor device, for example. Each of the processing circuitries may use the common processing circuitry (same processing circuitry), or may use different processing circuitries (separated processing circuitries). Input data needed in the control computer 110 or an operation result is stored in the memory 112 each time.

Figure 7:
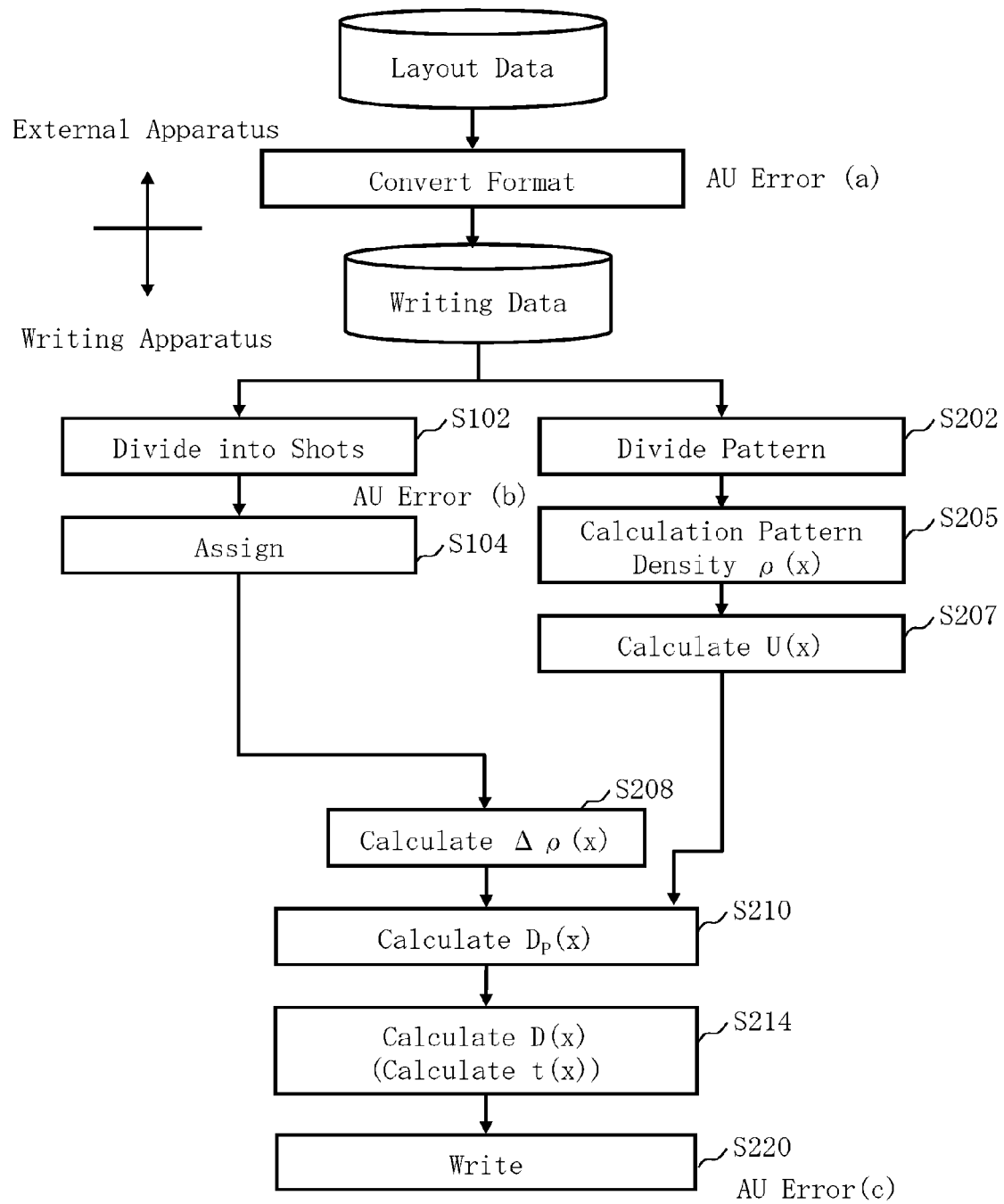
FIG. 7 is a flowchart showing main steps of a writing method according to the second embodiment.

FIG. 7 is a flowchart showing main steps of a writing method according to the second embodiment. As shown in FIG. 7, the writing method of the second embodiment executes a series of steps: the dividing-into-shots step (S102), the assignment step (S104), a pattern dividing step (S202), a pattern density $\rho(x)$ calculation step (S205), a proximity effect density $U(x)$ calculation step (S207), a $\Delta\rho(x)$ calculation step (S208), the proximity effect correction dose coefficient $D_p(x)$ calculation step (S210), the dose $D(x)$ calculation step (S214), and the writing step (S220). It is preferable that the step group composed of the dividing-into-shots step (S102) and the assignment step (S104) is performed in parallel with the step group composed of the pattern dividing step (S202), the pattern density $\rho(x)$ calculation step (S205), and the proximity effect density $U(x)$ calculation step (S207). However, it is not limited thereto. The step group composed of the dividing-into-shots step (S102) and the assignment step (S104) may be performed in series with the step group composed of the pattern dividing step (S202), the pattern density $\rho(x)$ calculation step (S205), and the proximity effect density $U(x)$ calculation step (S207). Whichever one of the two step groups may be performed first.

The contents of the dividing-into-shots step (S102) and the assignment step (S104) are the same as those in the first embodiment.

In the pattern dividing step (S202), first, the dividing-into-proximity-meshes processing circuitry 62 divides the writing region 10 of the target object 101 into a plurality of proximity effect mesh regions. As described above, the size of the proximity effect mesh region is set to, for example, about ⅒ of the influence radius of the proximity effect. For example, it is preferably set to about 1 μm. Next, the pattern dividing processing circuitry 80 reads writing data from the storage device 140, and divides a figure pattern defined in the writing data, per proximity effect mesh region. It goes without saying that a figure pattern smaller than a proximity effect mesh region should be assigned to the proximity effect mesh region, without being divided. Thus, a figure pattern before being divided into a plurality of shot figures is divided per proximity effect mesh region.

In the pattern density $\rho(x)$ calculation step (S205), the $\rho(x)$ calculation processing circuitry 69 calculates a pattern density $\rho(x)$ for each proximity effect mesh region.

In the proximity effect density $U(x)$ calculation step (S207), the $U(x)$ calculation processing circuitry 71 calculates a proximity effect density $U(x)$ by using a figure pattern before being divided into a plurality of shot figures. The proximity effect density $U(x)$ can be defined by the equation (2) described above.

In the $\Delta\rho(x)$ calculation step (S208), the $\Delta\rho(x)$ calculation processing circuitry 82 calculates a difference $\Delta\rho(x)$ between a pattern density $\rho(x)$ based on a figure pattern before being divided into a plurality of shot figures and a pattern density $\rho'(x)$ based on a shot figure to be finally written. The difference $\Delta\rho(x)$ is calculated, for example, by subtracting the pattern density $\rho'(x)$ based on a shot figure to be finally written from the pattern density $\rho(x)$ based on a figure pattern before being divided into a plurality of shot figures. Since the proximity effect density $U(x)$ described above has been calculated based on a figure pattern defined in the writing data, an AU error (a) that occurs when layout data is converted into writing data is included. However, an AU error (b) that occurs when a figure pattern is divided into a plurality of shot figures and an AU error (c) that occurs when converted into a deflection voltage by the DAC amplifier 132 are not included. Then, a pattern density $\rho'(x)$ based on a shot figure including an AU error (b) and an AU error (c) is further calculated, and then, a difference $\Delta\rho(x)$ between the pattern density $\rho'(x)$ and the pattern density $\rho(x)$ including only an AU error (a) in a plurality of AU errors is calculated. The AU error (b) and the AU error (c) can be calculated by using each AU deviation information stored in the storage device 144, the size and position of a figure pattern before division, and the size and position of a shot figure after division. Therefore, it is possible to calculate a pattern density $\rho'(x)$ which includes accumulated AU errors and is based on a shot figure to be finally written. Alternatively, a pattern density with respect to a size error generated between the AU error (b) and the AU error (c) is calculated to be regarded as a difference $\Delta\rho(x)$, thereby leading to the same result.

Here, if the figure size is changed due to the AU error (b) and the AU error (c), the pattern density $\rho'(x)$ based on a shot figure to be finally written can be defined as $\rho'(x)=\rho(x)+\Delta\rho(x)$. The difference $\Delta\rho(x)$ indicates an area density change of the amount of the figure size having been changed due to the AU error (b) and the AU error (c). Therefore, the proximity effect density $U'(x)$ based on a shot figure to be finally written can be defined by the following equation (6). It is based on the assumption that calculation of the proximity effect density $U'(x)$ is performed per mesh (proximity effect mesh) for proximity effect correction.

$$U'(x) = \int \rho'(x')g(x-x')d\,x' \qquad (6)$$
$$= \int g(x-x')(\rho(x')+\Delta\rho(x'))d\,x'$$

-continued $$= U(x) + \int g(x-x')\Delta\rho(x')d\,x'$$

$$= U(x) + \text{Error}(x)$$

Figures 8A, 8B, 8C:
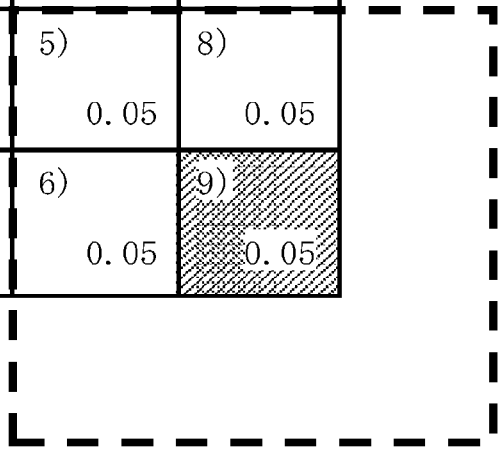
FIGS. 8A to 8C illustrate a calculation method of $\Delta\rho(x)$ according to the second embodiment.
Figure 9:
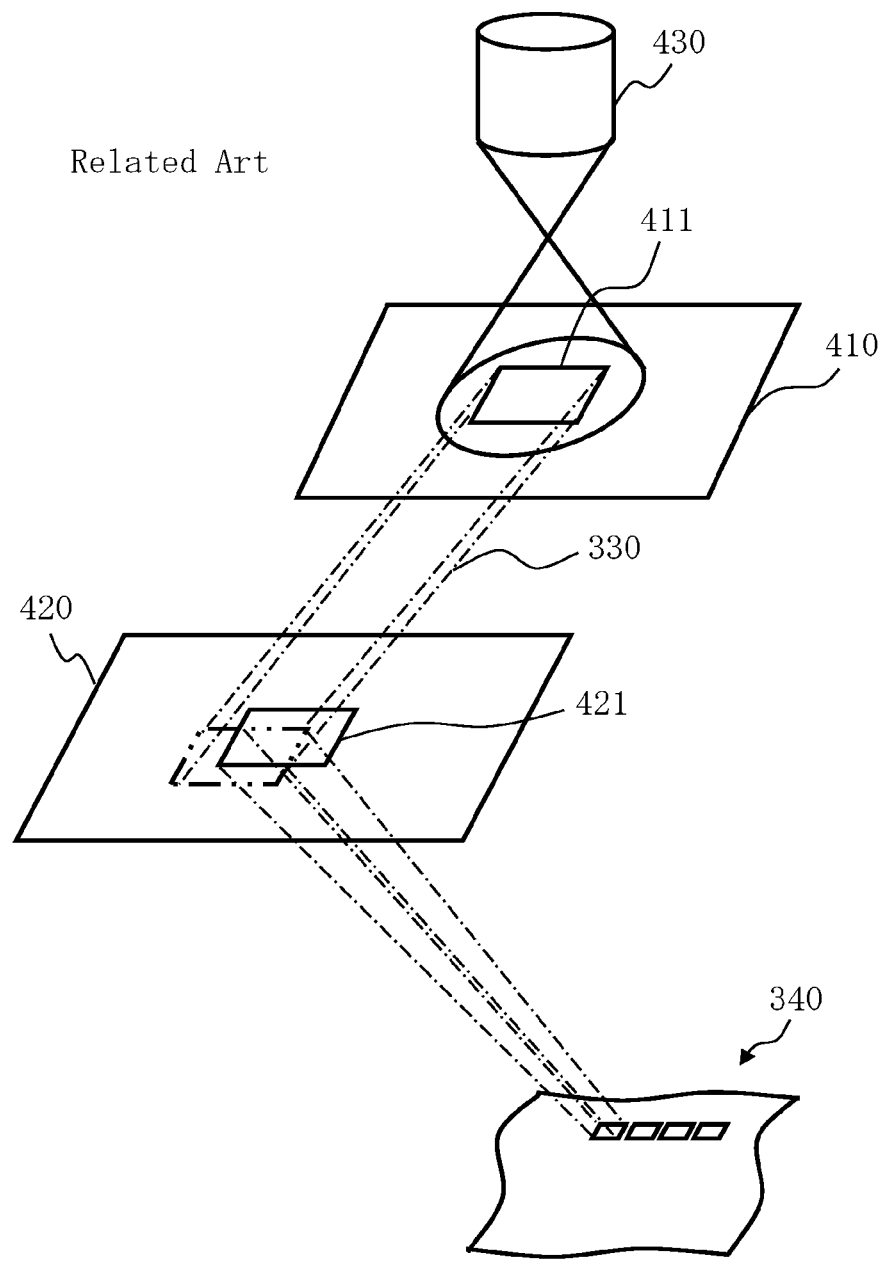
FIG. 9 is a conceptual diagram explaining operations of a variable-shaped electron beam writing apparatus.

FIGS. 8A to 8C illustrate a calculation method of $\Delta\rho(x)$ according to the second embodiment. FIG. 8A shows an example of the difference $\Delta\rho(x)$ of the pattern density for each adjoining proximity effect mesh. Here, according to the second embodiment, when calculating the second term on the right side of the equation (6), as shown in FIGS. 8B and 8C, the values of the difference $\Delta\rho(x)$ of the proximity effect meshes in the integration range surrounding the proximity effect mesh being a calculation target are assumed to be the same value as that of the proximity effect mesh being a calculation target. Thereby, the correction term Error (x) of the second term on the right side of the equation (6) can be approximated to $\Delta\rho(x)$. That is, the equation (6) can be approximated as the following equation (7).

$$U'(x) = \int \rho'(x')g(x-x')d\,x' \qquad (7)$$

$$= \int g(x-x')(\rho(x') + \Delta\rho(x'))d\,x'$$

$$= U(x) + \Delta\rho(x)$$

Accordingly, the difference $\Delta\rho(x)$ serves as a correction term for correcting an error of the proximity effect density of a figure pattern to be written compared against a design figure pattern. Therefore, in the $\Delta\rho(x)$ calculation step (S208), the $\Delta\rho(x)$ calculation processing circuitry 82 calculates a correction term for correcting an error of the proximity effect density of a figure pattern to be written compared against a design figure pattern. The $\Delta\rho(x)$ calculation processing circuitry 82 is an example of a correction term calculation processing circuitry. By using the equation (7), it is possible to omit the convolution integral whose integration range is the surrounding proximity effect meshes. Consequently, the calculation time can be greatly reduced.

In the proximity effect correction dose coefficient $D_p(x)$ calculation step (S210), the $D_p(x)$ calculation processing circuitry 72 calculates a proximity effect correction dose coefficient $D_p(x)$ for correcting a proximity effect, by using a calculated proximity effect density U(x) which was calculated in the proximity effect density U(x) calculation step (S207), and a calculated difference $\Delta\rho(x)$ which was calculated in the $\Delta\rho(x)$ calculation step (S208). The proximity effect correction dose coefficient $D_p(x)$ can be defined by the following equation (8).

$$D_p(x) = \frac{\frac{1}{2} + \eta}{\frac{1}{2} + \eta\{U(x) + \Delta\rho(x)\}} \qquad (8)$$

According to the second embodiment, by calculating a proximity effect density U(x) in a proximity effect mesh, the number of regions can be reduced compared with the number of meshes to which divided shot figures are assigned, and therefore, the calculation time can be shortened. Moreover, since the calculation method of the proximity effect density U(x) in the proximity effect density U(x) calculation step (S207) is the same as that of the conventional proximity effect correction calculation, the conventional calculation mechanism can be used as it is.

The contents of the dose D(x) calculation step (S214) and the writing step (S220) are the same as those of the first embodiment.

As described above, according to the second embodiment, while reducing the calculation time compared with that of the first embodiment, it is possible to perform calculation such that the correction residual error of the proximity effect resulting from a plurality of $\Delta U$ errors is eliminated. Therefore, patterns can be written with high accuracy in dimensions, and the throughput of the apparatus can be improved.

Embodiments have been explained referring to concrete examples described above. However, the present invention is not limited to these specific examples. For example, according to the second embodiment, although calculation is performed while substituting $\Delta\rho(x)$ for Error (x) of the second term on the right side of the equation (6), it is not limited thereto. The proximity effect correction dose coefficient $D_p(x)$ of the equation (4) (or equation (8)) may be calculated using the correction term Error (x) without substitution.

While the apparatus configuration, control method, and the like not directly necessary for explaining the present invention are not described, some or all of them can be selectively used case-by-case basis. For example, although description of the configuration of the control unit for controlling the writing apparatus 100 is omitted, it should be understood that some or all of the configuration of the control unit can be selected and used appropriately when necessary.

In addition, any other charged particle beam writing apparatus and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
   a dividing-into-shots processing circuitry configured to divide a figure pattern into a plurality of shot figures each having a size that can be irradiated by one shot of a charged particle beam;
   a proximity effect density calculation processing circuitry configured to calculate a proximity effect density by using the figure pattern before being divided into the plurality of shot figures;
   a correction term calculation processing circuitry configured to calculate a correction term which corrects an error of the proximity effect density of the figure pattern to be written, compared against the figure pattern at design stage;
   a proximity effect correction dose coefficient calculation processing circuitry configured to calculate a proximity effect correction dose coefficient for correcting a proximity effect, by using the correction term;
   a dose calculation processing circuitry configured to calculate a dose of the charged particle beam by using the proximity effect correction dose coefficient; and a writing mechanism, including a charged particle source, a deflector and a stage on which a target object is placed, configured to write the figure pattern on the target object by using the charged particle beam whose dose is the dose calculated.

2. The apparatus according to claim 1, wherein the correction term is an error value of a pattern density of the figure pattern to be written, compared against the figure pattern at the design stage.

3. The apparatus according to claim 1, wherein the correction term calculation processing circuitry calculates, as the correction term, a difference by subtracting a pattern density based on the plurality of shot figures to be finally written, from a pattern density based on the figure pattern before being divided into the plurality of shot figures.

4. The apparatus according to claim 3, wherein the proximity effect correction dose coefficient calculation processing circuitry calculates the proximity effect correction dose coefficient by using the proximity effect density that has been calculated and the difference that has been calculated.

5. The apparatus according to claim 1, wherein the error occurs due to an address unit error.

6. A charged particle beam writing apparatus comprising:
a dividing-into-shots processing circuitry configured to divide a figure pattern into a plurality of shot figures each having a size that can be irradiated by one shot of a charged particle beam;
a pattern density calculation processing circuitry configured to calculate, by using the plurality of shot figures having been divided, a pattern density in consideration of a dimension error that occurs in a case where the plurality of shot figures is actually written;
a proximity effect correction dose coefficient calculation processing circuitry configured to calculate a proximity effect correction dose coefficient for correcting a proximity effect, by using the pattern density;
a dose calculation processing circuitry configured to calculate a dose of the charged particle beam by using the proximity effect correction dose coefficient; and
a writing mechanism, including a charged particle source, a deflector and a stage on which a target object is placed, configured to write the figure pattern on the target object by using the charged particle beam whose dose is the dose calculated.

7. The apparatus according to claim 6, further comprising:
a digital-analog converter (DAC) amplifier configured to generate a deflection voltage for shaping the charged particle beam, based on the plurality of shot figures having been divided,
wherein an error that occurs in a case where the deflection voltage is generated by the DAC amplifier is used as the dimension error.

8. The apparatus according to claim 7, wherein the dimension error is an address unit error.

9. A charged particle beam writing method comprising:
dividing a figure pattern into a plurality of shot figures each having a size that can be irradiated by one shot of a charged particle beam;
calculating a proximity effect density by using the figure pattern before being divided into the plurality of shot figures;
calculating a correction term which corrects an error of the proximity effect density of the figure pattern to be written, compared against the figure pattern at design stage;
calculating a proximity effect correction dose coefficient for correcting a proximity effect, by using the correction term;
calculating a dose of the charged particle beam by using the proximity effect correction dose coefficient; and
writing the figure pattern on a target object by using the charged particle beam whose dose is the dose calculated.

10. A charged particle beam writing method comprising:
dividing a figure pattern into a plurality of shot figures each having a size that can be irradiated by one shot of a charged particle beam;
calculating, by using the plurality of shot figures having been divided, a pattern density in consideration of a dimension error that occurs when the plurality of shot figures is actually written;
calculating a proximity effect correction dose coefficient for correcting a proximity effect, by using the pattern density which has been calculated using the plurality of shot figures;
calculating a dose of the charged particle beam by using the proximity effect correction dose coefficient; and
writing the figure pattern on a target object by using the charged particle beam whose dose is the dose calculated.

* * * * *